(12) United States Patent
Otani et al.

(10) Patent No.: US 12,330,212 B2
(45) Date of Patent: Jun. 17, 2025

(54) THIN SHEET-LIKE CONNECTING MEMBER AND MANUFACTURING METHOD THEREFOR, SEMICONDUCTOR DEVICE AND MANUFACTURING METHOD THEREFOR, AND POWER CONVERSION DEVICE

(71) Applicant: Mitsubishi Electric Corporation, Tokyo (JP)

(72) Inventors: Issei Otani, Tokyo (JP); Hiroaki Tatsumi, Tokyo (JP); Jumpei Sawada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 532 days.

(21) Appl. No.: 17/759,295

(22) PCT Filed: Feb. 15, 2021

(86) PCT No.: PCT/JP2021/005430
§ 371 (c)(1),
(2) Date: Jul. 22, 2022

(87) PCT Pub. No.: WO2021/177006
PCT Pub. Date: Sep. 10, 2021

(65) Prior Publication Data
US 2023/0055157 A1    Feb. 23, 2023

(30) Foreign Application Priority Data

Mar. 6, 2020  (JP) ................................. 2020-038605

(51) Int. Cl.
*B22F 1/18* (2022.01)
*B22F 1/00* (2022.01)
(Continued)

(52) U.S. Cl.
CPC .................. *B22F 1/18* (2022.01); *B22F 1/00* (2013.01); *B22F 7/08* (2013.01); *H01B 1/22* (2013.01);
(Continued)

(58) Field of Classification Search
CPC ..... H01L 21/52; H01L 23/3735; H01L 24/73; H01L 2224/32225; B22F 1/18; B22F 1/00; B22F 7/008; B22F 7/00
See application file for complete search history.

(56) References Cited

U.S. PATENT DOCUMENTS 9,044,816 B2 *   6/2015  Nakano ................ B23K 1/0016
11,819,915 B2 * 11/2023  Washizuka ................ C22C 9/06
(Continued)

FOREIGN PATENT DOCUMENTS

JP    2002254194 A    9/2002
WO      0228574 A1    4/2002

OTHER PUBLICATIONS

International Search Report (PCT/ISA/210) with English translation and Written Opinion (PCT/ISA/237) mailed on May 11, 2021, by the Japan Patent Office as the International Searching Authority for International Application No. PCT/JP2021/005430.

*Primary Examiner* — Zandra V Smith
*Assistant Examiner* — John M Parker
(74) *Attorney, Agent, or Firm* — BUCHANAN, INGERSOLL & ROONEY PC

(57) ABSTRACT

A method for manufacturing a thin sheet-like bonding member, including applying a paste including first particles including a first metal, second particles including a second metal having a lower melting point than the first metal, and a solvent to a surface of a base material made of a substance that does not react with the second metal; heating the paste at a temperature lower than a melting point of the first metal (Continued)

and higher than the melting point of the second metal to form a thin sheet-like bonding member on the surface of the base material; and peeling the thin sheet-like bonding member from the base material to obtain the thin sheet-like bonding member.

20 Claims, 13 Drawing Sheets

(51) Int. Cl.
  *B22F 7/08*    (2006.01)
  *H01B 1/22*    (2006.01)
  *H01L 21/52*    (2006.01)

(52) U.S. Cl.
  CPC .... *H01L 21/52* (2013.01); *H01L 2224/32225* (2013.01)

(56) References Cited

U.S. PATENT DOCUMENTS

| | | |
|---|---|---|
| 2002/0100986 A1 | 8/2002 | Soga et al. |
| 2004/0079194 A1 | 4/2004 | Nakata et al. |
| 2010/0291399 A1* | 11/2010 | Kato .......................... C22C 1/04 228/141.1 |
| 2013/0299236 A1* | 11/2013 | Nakano .............. B23K 35/0238 228/249 |

* cited by examiner

THIN SHEET-LIKE CONNECTING MEMBER AND MANUFACTURING METHOD THEREFOR, SEMICONDUCTOR DEVICE AND MANUFACTURING METHOD THEREFOR, AND POWER CONVERSION DEVICE

TECHNICAL FIELD

The present disclosure relates to a thin sheet-like bonding member and a manufacturing method therefor, a semiconductor device and a manufacturing method therefor, and a power conversion device.

BACKGROUND ART

In a semiconductor device for power conversion used for motor inverter control and the like, a vertical semiconductor element such as an IGBT (Insulated Gate Bipolar Transistor), a diode, or a MOSFET (Metal-Oxide-Semiconductor Field-Effect Transistor) is mounted.

For example, electrodes are formed on the front surface and back surface of the semiconductor element by metal metallization. In the case of a general semiconductor device, the back surface electrode on the semiconductor element and a substrate are often connected to each other via a solder bonding portion. The amount of heat generation of a semiconductor element tends to increase, and therefore it is desired that a bonding material used for a power module have a high melting point and have high heat resistance performance. However, a solder material that is lead-free and has high heat resistance performance has not been found in the present state.

As an alternative measure, the development of a sinter bonding technique in which nanosized fine particles of silver or the like are sintered to achieve bonding is underway. But it is necessary to apply application pressure in the bonding step so as to press the semiconductor element against the substrate, and therefore problems in the present state are that the extent of damage to the element and contamination is large, and the productivity is poor.

Under such circumstances, instead of the solder bonding technique or sinter bonding technique described above, Transient Liquid Phase Bonding: TLP bonding is being studied. For this bonding technique, a bonding material composed of metal particles that melt at bonding temperature (low melting point metal particles: second particles) and metal particles that do not melt at the temperature (high melting point metal particles: first particles) is used. When the bonding material described above is heated, the second particles melt, wet and spread, and come into contact with the surfaces of the first particles, and thus both react with each other. As a result, an intermetallic compound having a melting point higher than the bonding temperature is formed. The low melting point metal is consumed by this reaction and disappears, and as a result, for the bonding portion, a high melting point bonding portion that does not remelt even if exposed to the bonding temperature again can be obtained.

In PTL 1 (Japanese Patent Laying-Open No. 2002-254194), a bonding material and a bonding method based on the thought are disclosed. In PTL 1, a paste made using Sn particles and Cu particles as low melting point metal particles (second particles) and high melting point metal particles (first particles) respectively and mixing them with a flux is applied to a printed board, a semiconductor chip, and the like and then heated for bonding. PTL 1 is characterized in that after the bonding, as a result of the reaction of both, a state in which the Cu particles are joined together by an intermetallic compound including $Cu_6Sn_5$ is reached. Thus, after the bonding, Sn having a low melting point is consumed, and therefore a bonding portion having high heat resistance including high melting point Cu particles and an intermetallic compound including high melting point $Cu_6Sn_5$ is obtained.

In PTL 2 (WO 2002/028574), a bonding material including Sn particles and Cu particles is disclosed, as in PTL 1. The difference from PTL 1 is that it includes an organic binder resin. It is considered that the bonding material is devised with the expectation that a bonding portion reaches a state in which the Cu particles are joined together by an intermetallic compound including $Cu_6Sn_5$ as in PTL 1, and the space among them is filled with the resin.

CITATION LIST

Patent Literature

PTL 1: Japanese Patent Laying-Open No. 2002-254194
PTL 2: WO 2002/028574

SUMMARY OF INVENTION

Technical Problem

During heating, a solvent included in a paste volatilizes inside the paste. After the volatilization, the solvent at the end of the paste is discharged outside a bonding portion, but the solvent in the central portion of the paste is not discharged outside because the periphery is surrounded by objects to be bonded and the paste at the end. Therefore, after the completion of the heating, the place where the solvent inside the bonding portion was present is a large cavity, that is, non-bonding portion. When the large non-bonding portion remains inside the bonding portion, a decrease in bonding strength and a decrease in heat dissipation performance are caused.

Therefore, it is an object of the present disclosure to provide a thin sheet-like bonding member with which the formation of a cavity (non-bonding portion) can be suppressed in a bonding portion between a conductor member (circuit board) and a semiconductor element.

Solution to Problem

A method for manufacturing a thin sheet-like bonding member, including:
  applying a paste including first particles including a first metal, second particles including a second metal having a lower melting point than the first metal, and a solvent to a surface of a base material made of a substance that does not react with the second metal;
  heating the paste at a temperature lower than a melting point of the first metal and higher than the melting point of the second metal to form a thin sheet-like bonding member on the surface of the base material; and
  peeling the thin sheet-like bonding member from the base material to obtain the thin sheet-like bonding member.

Advantageous Effects of Invention

According to the present disclosure, it is possible to provide a thin sheet-like bonding member with which the formation of a cavity (non-bonding portion) can be suppressed in a bonding portion between a conductor member (circuit board) and a semiconductor element.

DESCRIPTION OF EMBODIMENTS

Figure 1:
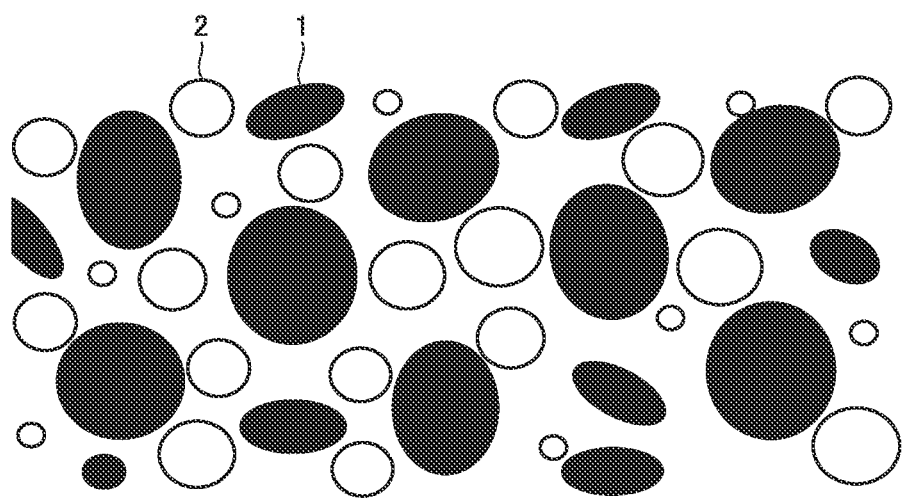
FIG. 1 is a schematic diagram of a bonding material that is the raw material of a thin sheet-like bonding member in Embodiment 1.

Embodiments of the present disclosure will be described below. In the drawings, identical numerals indicate identical or corresponding parts. In the drawings, the dimensional relationship between length, width, thickness, depth, and the like is appropriately changed for the clarification and simplification of the drawings and does not represent the actual dimensional relationship.

Embodiment 1

Embodiment 1 relates to a method for manufacturing a thin sheet-like bonding member.

FIG. 1 is a schematic diagram of a bonding material that is the raw material of a thin sheet-like bonding member in Embodiment 1.

Figure 11:
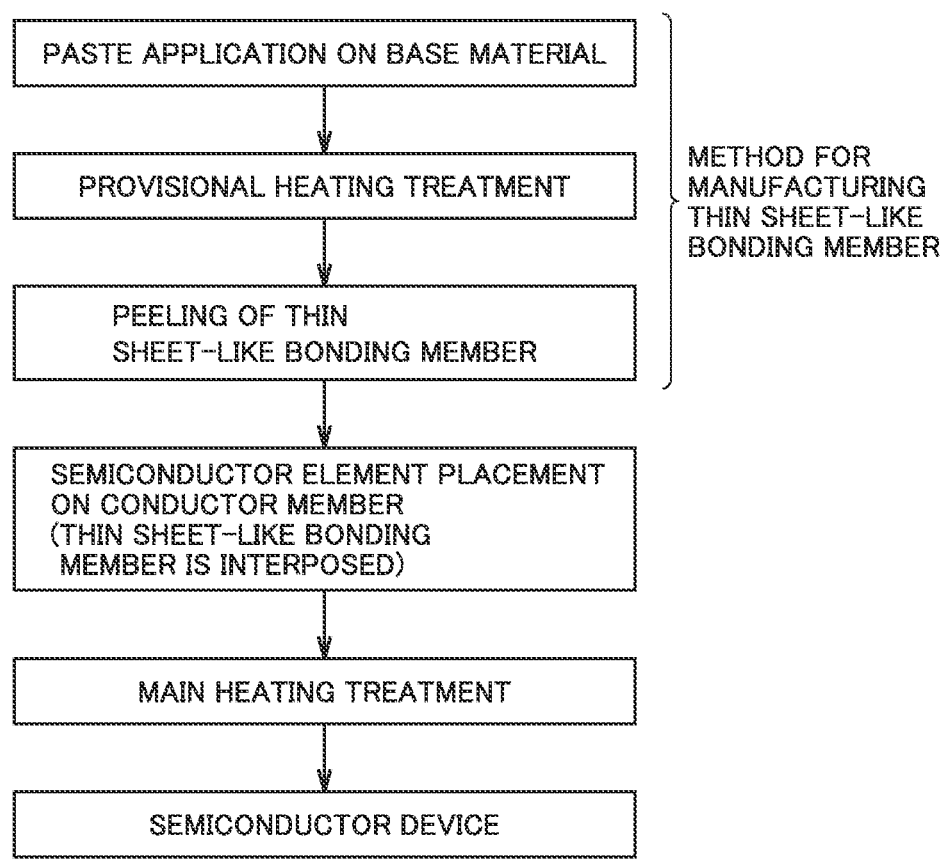
FIG. 11 is a flow chart showing the procedure of the manufacture of the semiconductor device in Embodiment 5.

The method for manufacturing a thin sheet-like bonding member in this embodiment includes:

the step of applying a paste including first particles 1 including a first metal (high melting point metal), second particles 2 including a second metal (low meting point metal) having a lower melting point than the first metal, and a solvent to a surface of a base material made of a substance that does not react with the second metal (paste application on a base material);

the step of heating the paste at a temperature lower than the melting point of the first metal and higher than the melting point of the second metal to form a thin sheet-like bonding member on the surface of the base material (provisional heating treatment); and the step of peeling the thin sheet-like bonding member from the base material to obtain the thin sheet-like bonding member (the peeling of the thin sheet-like bonding member) (see FIG. 11).

(Paste Application on Base Material)

As the paste, for example, a paste prepared by mixing 40% by mass of Cu particles as first particles 1 (high melting point metal particles including the first metal) and 60% by mass of Sn particles as second particles 2 (low melting point metal particles including the second metal having a lower melting point than the first metal) and adding a solvent (for example, diethylene glycol) can be used.

The first metal is preferably one that can produce an intermetallic compound 4 with the melting second metal to ensure the connection between first particles 1. As the first metal, for example, Cu, Ag, Ni, Al, Zn, Au, Pt, Pd, alloys including these as main components, or mixtures thereof can be used.

The first metal preferably includes at least one metal selected from the group consisting of Cu, Ag, and Ni. These metals are high melting point metals that are inexpensive and have high thermal conductivity.

The second metal is not particularly limited as long as it is a metal having a lower melting point than the first metal. The second metal preferably includes at least one metal selected from the group consisting of Sn, Ag, Sb, Ni, P. Pt, Au, Bi, and In. These metals are highly versatile metals generally used as the material of lead-free solder.

The second metal preferably has a melting point lower than the bonding temperature of a semiconductor element in the manufacture of a semiconductor device. Considering that the bonding temperature of a semiconductor element is no more than 300° C., Sn, In, a Sn alloy including Sn and another element, an In alloy including In and another element, or a mixture thereof is preferably used as the second metal.

The shape of first particles 1 is not particularly limited and may be, for example, a spherical shape or a shape in which the irregularities of the surface are very large, such as a scale shape, a rod shape, or a tree shape. The shape of first particles 1 is preferably a shape in which adjacent first particles 1 can be in contact with each other. When the printability of the paste is considered, the shape of first particles 1 is most preferably a spherical shape.

The shape of second particles 2 is also not particularly limited. Second particles 2 are preferably disposed so as to uniformly join the gaps of first particles 1. For this, it is preferable that the particle diameter of second particles 2 be smaller than the particle diameter of first particles 1, and second particles 2 be spherical.

First particles 1 whose surfaces are plated with the second metal (low melting point metal) may be used. When the first particles are coated with plating of the second metal, the first metal and the second metal can be more reliably reacted with each other, and the production of intermetallic compound 4 around first particles 1 after the provisional heating treatment can be promoted.

The paste preferably includes a flux component for the cleaning or activation of the surfaces of the metal particles (the first particles and the second particles) that are faces to be bonded. When the paste includes a flux, the surfaces of the metal particles are cleaned or activated, and thus the reaction of the first particles with the second particles (the production reaction of the intermetallic compound including the first metal and the second metal) can be promoted.

As the flux, a component generally used for the activation of a solder material and the like can be used. Examples of the flux include rosin materials (natural rosins, hydrogenated rosins, polymerized rosins, and the like), monocarboxylic acids (formic acid, acetic acid, lauric acid, palmitic acid, stearic acid, and benzoic acid, and the like), dicarboxylic acids (oxalic acid, malonic acid, succinic acid, glutaric acid, adipic acid, suberic acid, azelaic acid, sebacic acid, phthalic acid, and the like), bromoalcohols (1-bromo-2-butanol and the like), hydrohalides of organic amines, bromoalkanes, bromoalkenes, benzyl bromides, and polyamines.

The paste may include a solvent component and the like for adjusting the properties, such as viscosity of the paste.

As the solvent, for example, a solvent having a boiling point lower than the melting point of the first particles, such as diethylene glycol, hexane, heptane, octane, decane, dodecane, cyclopentane, cyclohexane, cyclooctane, benzene, toluene, xylene, ethylbenzene, or water, can be used.

By supersaturating the solvent with the flux to improve the viscosity of the paste, the flux can have the role of a thickening agent. The flux and the solvent are omitted in the drawings.

Figure 2:
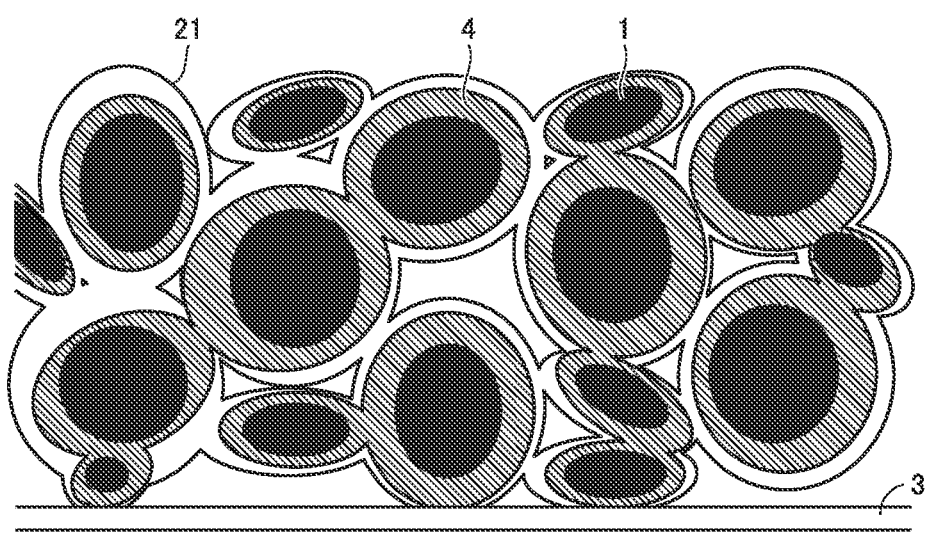
FIG. 2 is a schematic diagram of the thin sheet-like bonding member in Embodiment 1.

The paste is thinly applied on a surface of a base material 3 (a glass sheet or the like) using a squeegee or the like (see FIG. 2).

Base material 3 is made of a substance that does not react with the second metal. The substance constituting base material 3 is preferably a substance that also does not react with the first metal. As base material 3, for example, a glass sheet can be preferably used. Base material 3 should be one that does not react with the second metal in the paste during heating and easily allows the peeling of the thin sheet-like bonding member after heating, and as base material 3, a PTFE sheet, an Al sheet, or the like may be used.

(Provisional Heating Treatment)

The paste applied to base material 3 is subjected to heat treatment (provisional heating treatment) at a temperature lower than the melting point of the first metal (for example, Cu) and higher than the melting point of the second metal (for example, Sn).

The temperature, time, and the like of the provisional heating treatment may be arbitrarily adjusted in ranges in which the first metal and the unreacted second metal remain in the thin sheet-like bonding member obtained after the heating treatment.

The temperature of the heat treatment is preferably higher than the boiling point of the solvent. Thus, the solvent can be sufficiently volatilized by the provisional heating treatment, and therefore a thin sheet-like bonding member including no solvent can be obtained. By bonding a conductor member (circuit board) and a semiconductor element to each other using this thin sheet-like bonding member including no solvent, the formation of a cavity (non-bonding portion) can be suppressed in the bonding portion between the conductor member and the semiconductor element.

It is also possible to decrease the atmospheric pressure in the provisional heating treatment to decrease the boiling point of the solvent, or make a change, such as increasing the time of the heating treatment, and lower the temperature of the provisional heating treatment to no more than the boiling point of the solvent under normal temperature and pressure.

The provisional heating treatment can be carried out, for example, by heat treatment at 250° C. for 1 min. By carrying out the provisional heating treatment under a pressure of no more than 1 Pa (under vacuum), under an inert atmosphere such as nitrogen or argon, or under a reducing atmosphere such as a hydrogen atmosphere or a formic acid atmosphere, the melting of the second metal such as Sn can be promoted. During the provisional heating treatment, the upper portion of the paste is in an open state, and therefore the solvent volatilizes from the upper portion, and therefore the production of a cavity that is a cause of a non-bonding portion is suppressed inside the paste (thin sheet-like bonding member) after the heating treatment.

FIG. 2 is a schematic diagram of the thin sheet-like bonding member (after the provisional heating treatment) in Embodiment 1. Referring to FIG. 2, by carrying out the provisional heating treatment described above, part of the second metal (for example, Sn) in second particles 2 reacts with the first metal (for example, Cu) in first particles 1, and intermetallic compound 4 (for example, $Cu_6Sn_5$) is formed. A thin sheet having a coupling structure in which first particles 1 are joined together by the intermetallic compound 4 and the second metal (for example, Sn) (that is, the thin sheet-like bonding member) is obtained.

Here, the amount of the second metal that remains after the provisional heating treatment without reacting with the first metal is preferably no less than 5% by mass and no more than 80% by mass based on the total amount of the second metal before the provisional heating treatment. When the amount of the second metal is no more than 5% by mass, there is a possibility that the unreacted second metal in an amount necessary for heat treatment for bonding a semiconductor element and a conductor member to each other is insufficient in the manufacture of a semiconductor device using the thin sheet-like bonding member described later. When the amount of the second metal is no less than 80% by mass, there is a possibility that a strong bonding structure composed of the intermetallic compound and the first particles is not obtained.

(Peeling of Thin Sheet-Like Bonding Member)

Figure 3:
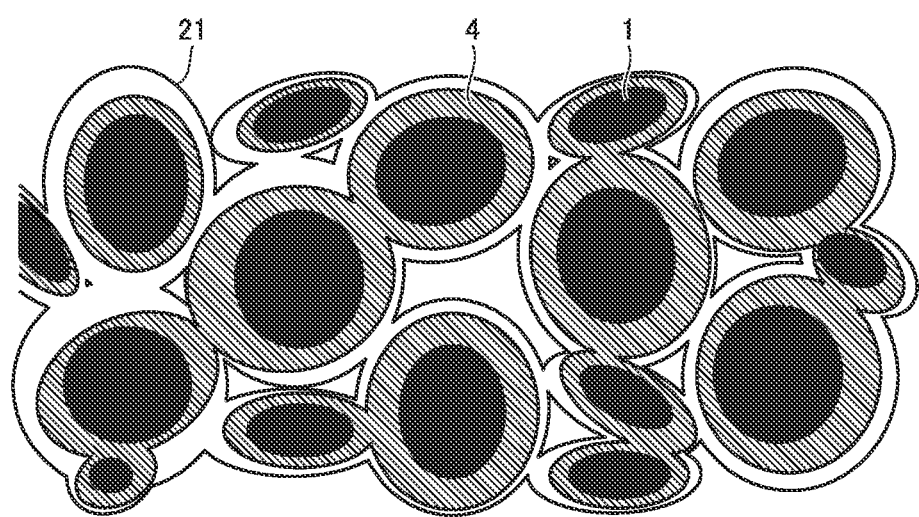
FIG. 3 is a schematic diagram of the thin sheet-like bonding member after peeling from a base material in Embodiment 1.

By peeling the thin sheet-like bonding member formed on base material 3 from base material 3 after the provisional heating treatment, the thin sheet-like bonding member can be obtained (see FIG. 3). Base material 3 (a glass sheet or the like) and the thin sheet-like bonding member do not react with each other, and therefore the thin sheet-like bonding member can be easily peeled by a spatula or the like.

The thin sheet-like bonding member obtained in this embodiment has high strength because compared with a similar thin sheet-like bonding member obtained by mixing and rolling metal particles, the first particles are joined using the intermetallic compound. In addition, the thin sheet-like bonding member is not rolled, and therefore minute pores can be left inside the thin sheet-like bonding member, and therefore the thin sheet-like bonding member obtained in this embodiment has high stress relaxation properties.

The thickness of the thin sheet-like bonding member is preferably 1 to 300 μm. When the thickness of the thin sheet-like bonding member is no more than 1 μm, there is a possibility that the strength as the member is low, and it is difficult to handle the thin sheet-like bonding member as a member for bonding. On the other hand, when the thickness of the thin sheet-like bonding member is no less than 300 μm, the thermal resistance increases, and the heat dissipation performance of a semiconductor element described later decreases, which is not practically desirable.

As described above, in this embodiment, a semiconductor element is placed on a conductor member in a state in which the thin sheet-like bonding member is interposed between the semiconductor element and the conductor member, and the thin sheet-like bonding member is heated at a temperature lower than the melting point of the first metal and higher than the melting point of the second metal. Thus, the unreacted second metal included inside the thin sheet-like bonding member can be melted, and the second metal and an electrode of a conductor member or a semiconductor element or the like can be reacted with each other to produce an intermetallic compound. Thus, the bonding between the semiconductor element and the conductor member is achieved.

Embodiment 2

Embodiment 2 relates to a method for manufacturing a thin sheet-like bonding member including a resin.

Figure 4:
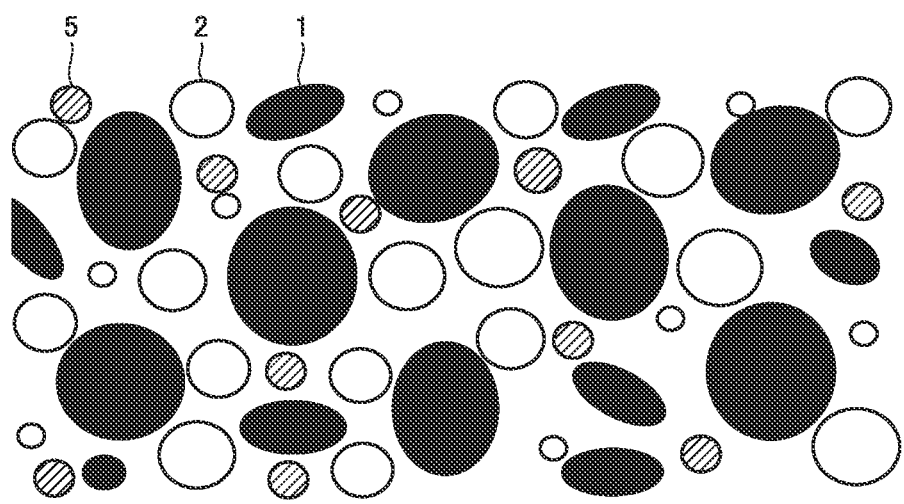
FIG. 4 is a schematic diagram of a bonding material that is the raw material of a thin sheet-like bonding member in Embodiment 2.

FIG. 4 is a schematic diagram of a bonding material that is the raw material of the thin sheet-like bonding member in Embodiment 2.

Referring to FIG. 4, in the method for manufacturing a thin sheet-like bonding member in this embodiment, the paste further includes resin particles 5. Otherwise Embodiment 2 is the same as Embodiment 1, and therefore redundant description is omitted.

As the paste, for example, a paste prepared by mixing 39% by mass of Cu particles as first particles 1, 59% by mass of Sn particles as second particles 2, and 2% by mass (10% in volume ratio) of a polyimide powder as resin particles 5 and adding a solvent (for example, diethylene glycol) can be used.

As in Embodiment 1, by thinly applying the paste on a base material and subjecting the paste to provisional heating treatment followed by peeling, the thin sheet-like bonding member can be obtained.

The thin sheet-like bonding member obtained in this embodiment includes a resin inside and therefore has high stress relaxation properties compared with Embodiment 1.

As resin particles 5, for example, a polyimide-based resin, an epoxy-based resin, a phenol-based resin, a polyurethane-based resin, a melamine-based resin, a urea-based resin, or the like can be used.

The amount of the resin blended is preferably 0.1 to 50% in volume ratio based on the total amount of the thin sheet-like bonding member. When the amount of the resin is smaller than this range, there is a possibility that the effect of providing stress relaxation properties is not sufficiently obtained. On the other hand, when the amount of the resin is larger than this range, it greatly exceeds the volume of the gaps other than the portions occupied by the first particles and the intermetallic compound, and therefore the uneven distribution of the resin and the inhibition of the metal reaction occur, and the bonding reliability tends to decrease.

The surfaces of resin particles 5 may be plated with the second metal (low melting point metal). When such resin particles 5 are used, the aggregation of resin particles 5 is suppressed, and resin particles 5 can be uniformly dispersed in the paste. Thus, the stress relaxation properties of the entire thin sheet-like bonding member can be improved.

Figure 5:
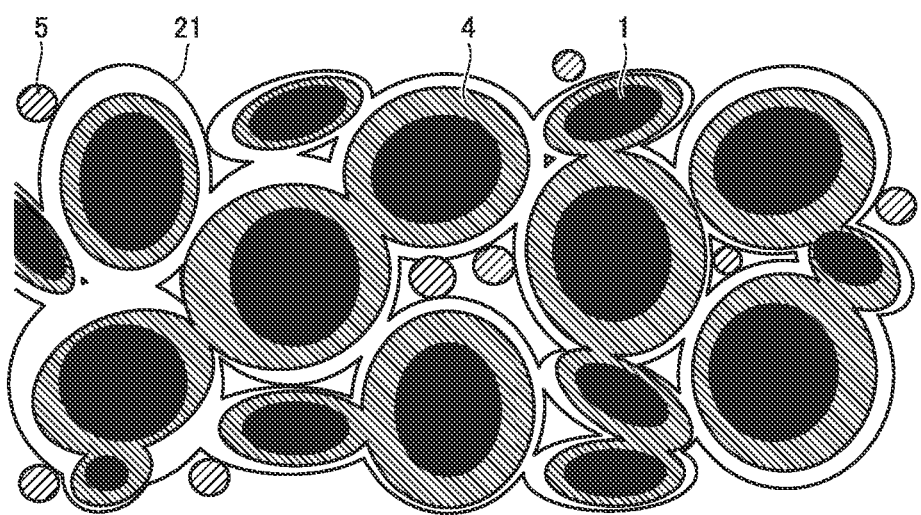
FIG. 5 is a schematic diagram of the thin sheet-like bonding member in Embodiment 2 when the melting point of resin particles is higher than heat treatment, temperature.
Figure 6:
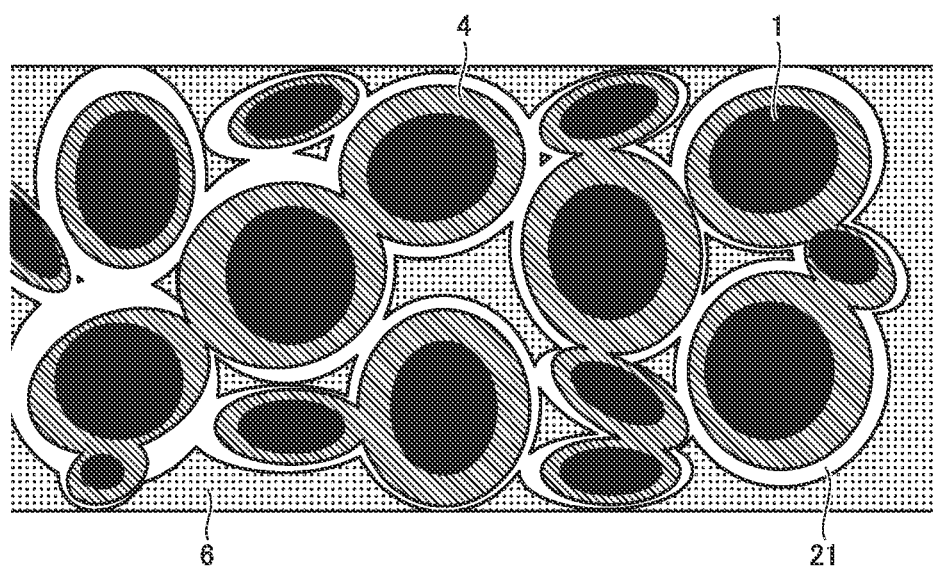
FIG. 6 is a schematic diagram of the thin sheet-like bonding member in Embodiment 2 when the melting point of the resin particles is lower than the heat treatment temperature.

When the melting point of resin particles 5 is higher than the heat treatment temperature, resin particles 5 disperse in the member, as shown in FIG. 5. On the other hand, when the melting point of the resin particles is lower than the heat treatment temperature, the resin melts once and then cures, and therefore a structure in which the gaps between the metal particles (the first particles and the intermetallic compound) are filled with a cured resin 6 is formed, as shown in FIG. 6. In either case, the high stress relaxation properties that the resin has can be provided to the thin sheet-like bonding member.

Embodiment 3

A method for manufacturing a thin sheet-like bonding member in Embodiment 3 further includes the step of immersing the thin sheet-like bonding member peeled from the base material in a thermosetting resin in liquid form.

Figure 7:
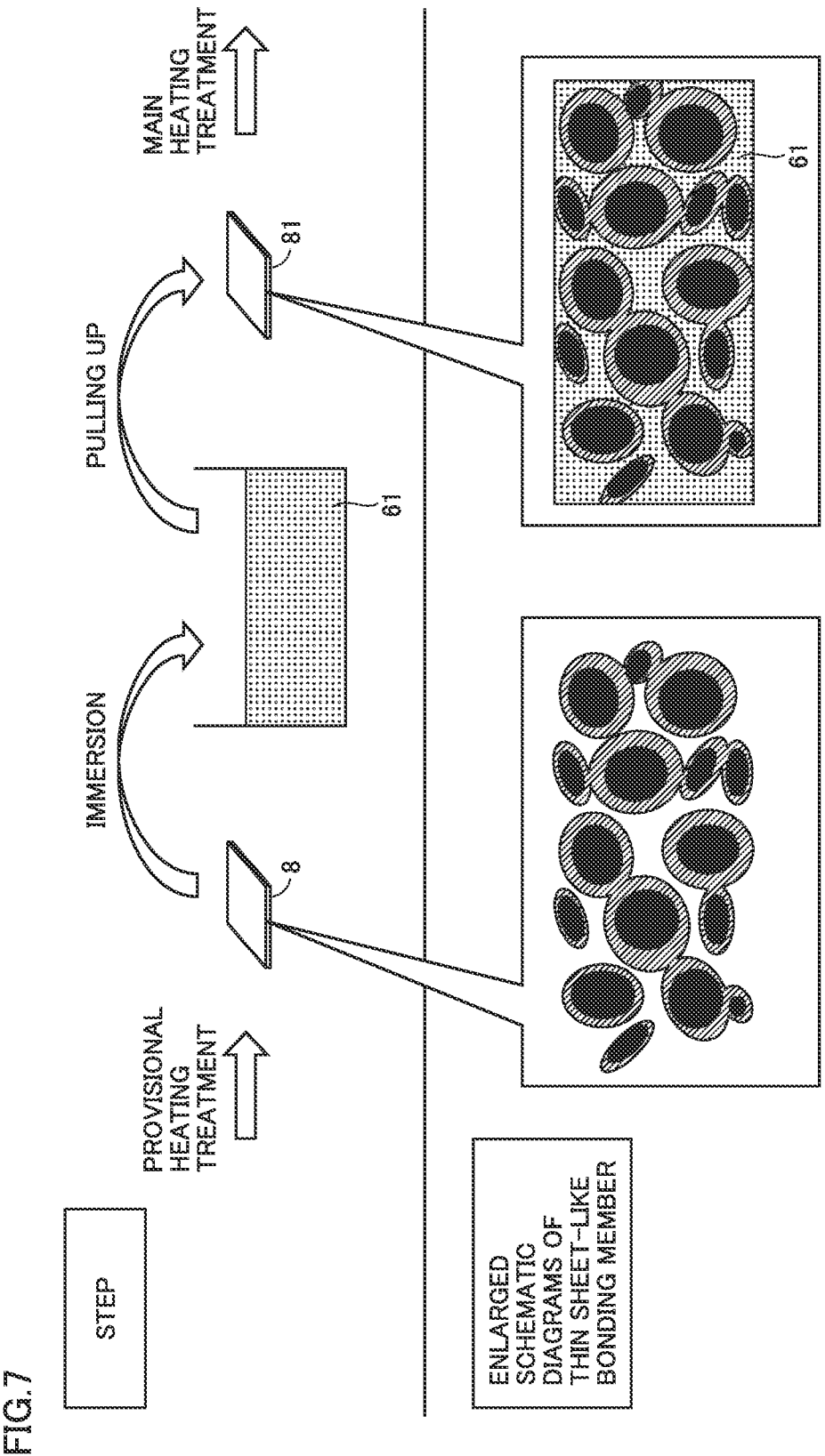
FIG. 7 is a schematic diagram showing a procedure in Embodiment 3.

FIG. 7 is a schematic diagram showing the procedure in Embodiment 3.

Referring to FIG. 7, in this embodiment, the thin sheet-like bonding member made by the method shown in Embodiment 1 or Embodiment 2 is immersed in a thermosetting resin in liquid form (before heat curing). Thus, the gaps between the metal particles of the thin sheet-like bonding member are filled with the thermosetting resin in liquid form. Subsequently, the resin cures by heating treatment for bonding a conductor member and a semiconductor element to each other (main heating treatment) described later or the like, and thus a thin sheet-like bonding member having the same structure as FIG. 6 can be obtained.

In this embodiment, the thermosetting resin is filled after the basic structure of the thin sheet-like bonding member is completed with first particles 1 and intermetallic compound 4. Thus, compared with the case where resin particles are previously mixed into the paste, the uneven distribution of the metal particles and the resin during heating treatment due to the difference in specific gravity between the metal particles and the resin particles can be prevented. Therefore, a thin sheet-like bonding member in which the dispersibility of the metal particles and the resin is good can be obtained. For such a thin sheet-like bonding member, the bonding properties to a semiconductor element, a conductor member, and the like described later improve, and the stress relaxation properties also improve.

In this embodiment, by polishing the surface of the thin sheet-like bonding member before the main heating treatment to remove the resin layer on the outermost surface, the bonding of the thin sheet-like bonding member to a semiconductor element, a conductor member, and the like described later can be promoted.

Embodiment 4

This embodiment relates to the thin sheet-like bonding member manufactured by any of the manufacturing methods.

In the thin sheet-like bonding member of this embodiment, the amount of the unreacted second metal is preferably no less than 5% by mass and no more than 80% by mass based on the total amount of the thin sheet-like bonding member. In this case, a semiconductor element and a conductor member can be reacted with the second metal in main heating treatment described later to obtain high bonding strength.

It is necessary that the melting point of the intermetallic compound including the first metal and the second metal as constituents be higher than the melting point of the second metal. In this case, higher heat resistance can be obtained.

In this embodiment, it is preferable that the first metal include Cu, the second metal include Sn, and the intermetallic compound include $Cu_6Sn_5$. $Cu_6Sn_5$ is an intermetallic compound including Cu and Sn that are a typical combination of a high melting point metal and a low melting point metal used for TIP bonding.

By bonding a substrate and a semiconductor element to each other using the thin sheet-like bonding member of this embodiment, the formation of a cavity (non-bonding portion) can be suppressed in the bonding portion between the substrate and the semiconductor element.

The thin sheet-like bonding member can be stored in a state of a thin sheet rather than a state of a paste, and therefore solvent volatilization prevention and measures against scattering are not necessary, the handling is simple, and it is possible to contribute to the downsizing of the facility, productivity improvement, and the like.

Embodiment 5

Embodiment 5 relates to a semiconductor device using the thin sheet-like bonding member described above, and a manufacturing method therefor.

Figure 8:
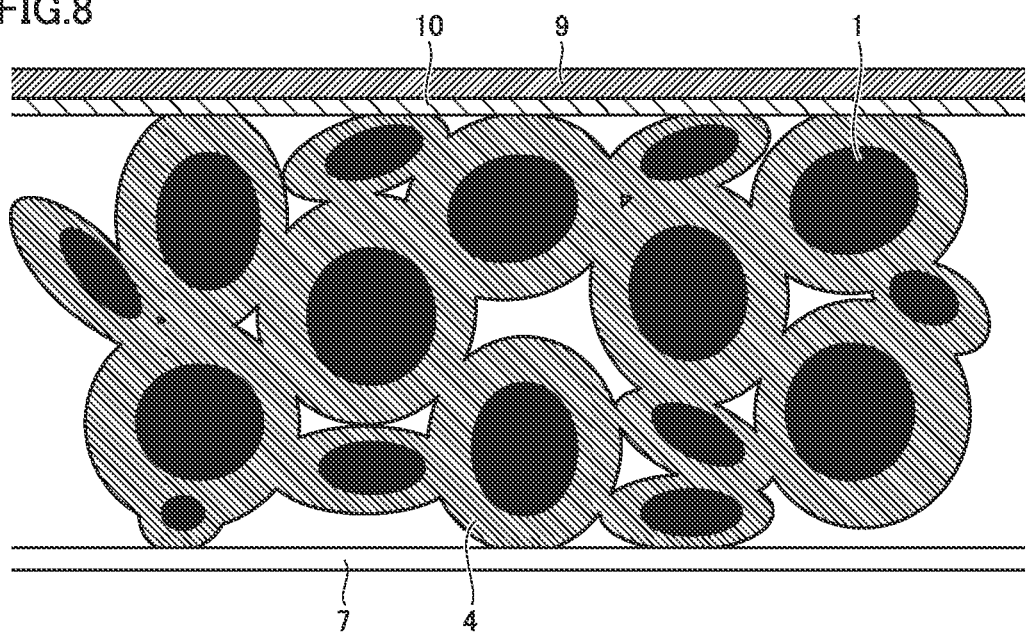
FIG. 8 is a cross-sectional schematic diagram showing the bonding structure of a semiconductor device in Embodiment 5.
Figure 9:
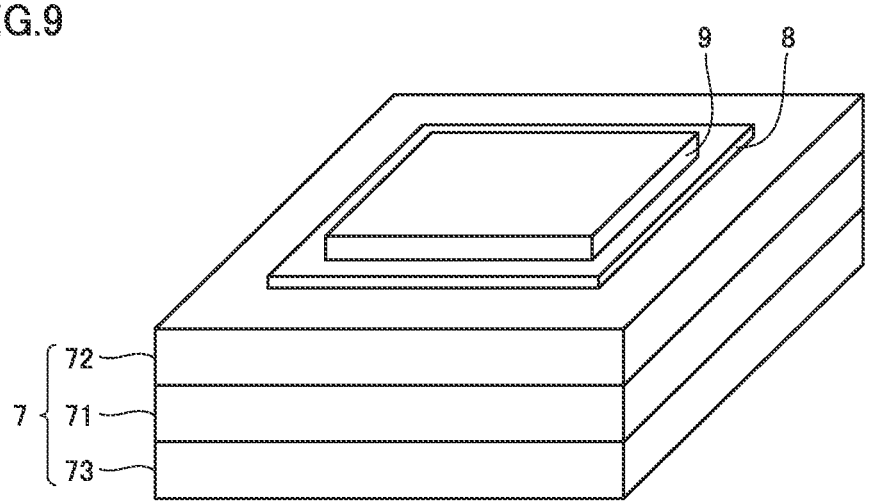
FIG. 9 is a perspective view of the semiconductor device in Embodiment 5.
Figure 10:
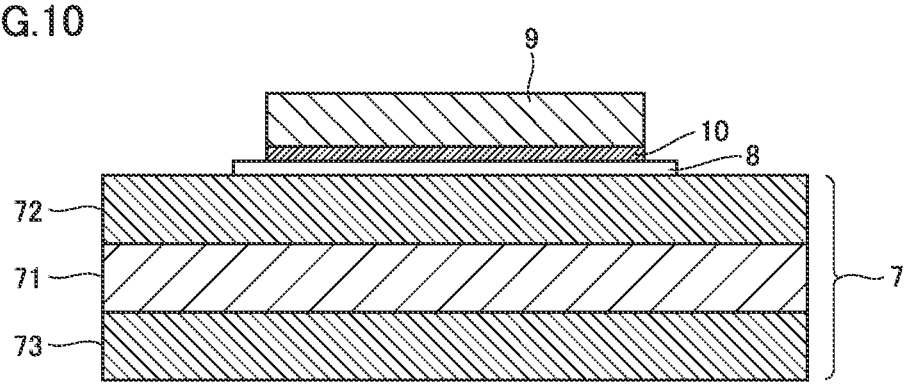
FIG. 10 is a cross-sectional schematic diagram of the semiconductor device shown in FIG. 9.

FIG. 8 is a cross-sectional schematic diagram showing the bonding structure of the semiconductor device in Embodiment 5. FIG. 9 is a perspective view of the semiconductor device in Embodiment 5. FIG. 10 is a cross-sectional schematic diagram of the semiconductor device shown in FIG. 9.

Mainly referring to FIGS. 9 and 10, the semiconductor device includes a conductor member 7 (circuit board) composed of an insulating layer 71 and electrodes 72 and 73 formed on both sides of insulating layer 71, and a semiconductor element 9 bonded to a surface of conductor member 7 using a thin sheet-like bonding member 8.

As the material of the insulating layer 71 of conductor member 7 (circuit board), for example, a ceramic sheet such as silicon nitride, alumina, or aluminum nitride can be used. From the viewpoint of the heat dissipation of the entire power semiconductor device having a large amount of heat generation, the material of insulating layer 71 is preferably a material having a thermal conductivity of no less than 20 W/m·K, further preferably a material having a thermal conductivity of no less than 70 W/m·K.

Examples of the materials of electrodes 72 and 73 provided on the front surface and back surface of insulating layer 71 include Cu, Au, Pt, Pd, Ag, Ni, and alloys including at least one of them. When metallization layers including Cu, Au, Pt, Pd, Ag, Ni, and an alloy including at least one of them, and the like are provided on the outermost surfaces of electrodes 72 and 73, Al, Ni, or the like may be used as the materials inside electrodes 72 and 73.

Semiconductor element 9 is formed of a semiconductor material, for example, silicon (Si), silicon carbide (SiC), gallium nitride (GaN), gallium arsenide (GaAs), or diamond (C), and the like.

A metallization layer 10 (back surface electrode) may be provided on the face of semiconductor element 9 used in the semiconductor device according to this embodiment opposed to conductor member 7 (the face bonded to conductor member 7 via thin sheet-like bonding member 8), in order to ensure bonding properties to thin sheet-like bonding member 8. Metallization layer 10 includes, for example, Au, Pt, Pd, Ag, Cu, Ni, or an alloy thereof.

Examples of the semiconductor element 9 using these materials include vertical semiconductor elements such as an IGBT (Insulated Gate Bipolar Transistor), a diode, and a MOSFET (metal-oxide-semiconductor field effect transistor).

Next, the method for manufacturing the semiconductor device in this embodiment will be described referring to FIG. 11 and the like. FIG. 11 is a flow chart showing the procedure of the manufacture of the semiconductor device in Embodiment 5.

First, thin sheet-like bonding member 8 is manufactured by the method described in any of Embodiments 1 to 3 (see "METHOD FOR MANUFACTURING THIN SHEET-LIKE BONDING MEMBER" in FIG. 11).

Next, referring to FIG. 10 and the like, semiconductor element 9 is placed on conductor member 7 in a state in which thin sheet-like bonding member 8 is interposed between semiconductor element 9 and conductor member 7 ("SEMICONDUCTOR ELEMENT PLACEMENT ON CONDUCTOR MEMBER (THIN SHEET-LIKE BONDING MEMBER IS INTERPOSED)" in FIG. 11).

In more detail, for example, first, thin sheet-like bonding member 8 is placed on conductor member 7 (circuit board). Next, semiconductor element 9 is placed on thin sheet-like bonding member 8. At this time, when, for example, a load of about 1 g to 10 kg (about 0.1 to 2000 kPa in terms of pressure) is applied in order to promote the close adhesion between conductor member 7, thin sheet-like bonding member 8, and semiconductor element 9, stable bonding properties are easily obtained. More preferably, by applying a load of about 100 g to 1000 g (about 10 to 100 kPa in terms of pressure), more stable bonding properties are easily obtained.

Before the semiconductor element placement on the conductor member, a liquid is preferably adhered to a surface of at least one of semiconductor element 9, thin sheet-like bonding member 8, and conductor member 7 (at least one of the contact faces between conductor member 7, thin sheet-like bonding member 8, and semiconductor element 9) by application, dropping, or the like. In this case, the movement of semiconductor element 9 and thin sheet-like bonding member 8 from the desired positions on conductor member 7 due to vibration or the like can be suppressed.

The liquid includes, for example, an organic solvent or an aqueous solution. The liquid preferably includes a flux. In this case, the activation of the metal surface can be promoted in subsequent main heating treatment.

When the liquid is used, the temperature in the step of heating thin sheet-like bonding member 8 (main heating treatment) is preferably higher than the boiling point of the liquid. By heating thin sheet-like bonding member 8 at a temperature higher than the boiling point of the liquid, the liquid can be sufficiently removed from the bonding portion.

When the liquid includes a flux, the temperature in the main heating treatment is preferably higher than the boiling point of the flux. By heating thin sheet-like bonding member 8 at a temperature higher than the boiling point of the flux, the flux can be removed from the bonding portion to omit a flux washing step after bonding.

Lastly, thin sheet-like bonding member 8 is heated at a temperature lower than the melting point of the first metal and higher than the inciting point of the second metal ("MAIN HEATING TREATMENT" in FIG. 11). By this main heating treatment, an unreacted second metal 21 included inside thin sheet-like bonding member 8 (see FIG. 3 and the like) is melted, and the second metal is reacted with the electrode 72 of conductor member 7, semiconductor element 9 (metallization layer 10), and the like to produce intermetallic compound 4, and thus bonding is achieved (see FIG. 8).

The main heating treatment is preferably carried out at a temperature higher than the provisional heating treatment for a time longer than the provisional heating treatment (for example, no less than 2 min) in order to sufficiently melt and react second metal 21. Specifically, for example, by carrying out the main heating treatment at 300° C. for 10 min, a semiconductor device having good bonding strength can be obtained.

By carrying out the main heating treatment under a vacuum of no more than 1 Pa or under an inert atmosphere such as nitrogen or argon or a reducing atmosphere such as a hydrogen atmosphere or a formic acid atmosphere, the melting and reaction of the second metal can be promoted.

According to this embodiment, the formation of a non-bonding portion on the inside is suppressed, and a semiconductor device having a bonding portion that can withstand operation at high temperature can be provided.

In order to ensure the bonding reliability between the conductor member and the semiconductor element, before the main heating treatment, a surface of semiconductor element 9 or conductor member 7 before bonding may be previously plated with a metal including the second metal (the second metal or an alloy including the second metal), or a thin sheet of a metal including the second metal may be sandwiched between semiconductor element 9 and thin sheet-like bonding member 8 or between thin sheet-like bonding member 8 and conductor member 7 (electrode 72). In either case, the second metal can be supplied to the bonding interface to enhance the bonding reliability.

Embodiment 6

This embodiment relates to a manufacturing method for obtaining higher bonding reliability between the conductor member and the semiconductor element, for the method for manufacturing the semiconductor device in Embodiment 5 described above.

In thin sheet-like bonding member 8 made in Embodiment 1, Embodiment 2, or Embodiment 3, a strong oxide film may be produced on its surface during the making or after the making. There is a possibility that the strong oxide film inhibits the bonding of thin sheet-like bonding member 8 to the electrode 72 of the circuit board (conductor member 7) and metallization layer 10 on the semiconductor element back surface during the main heating step.

Figure 12:
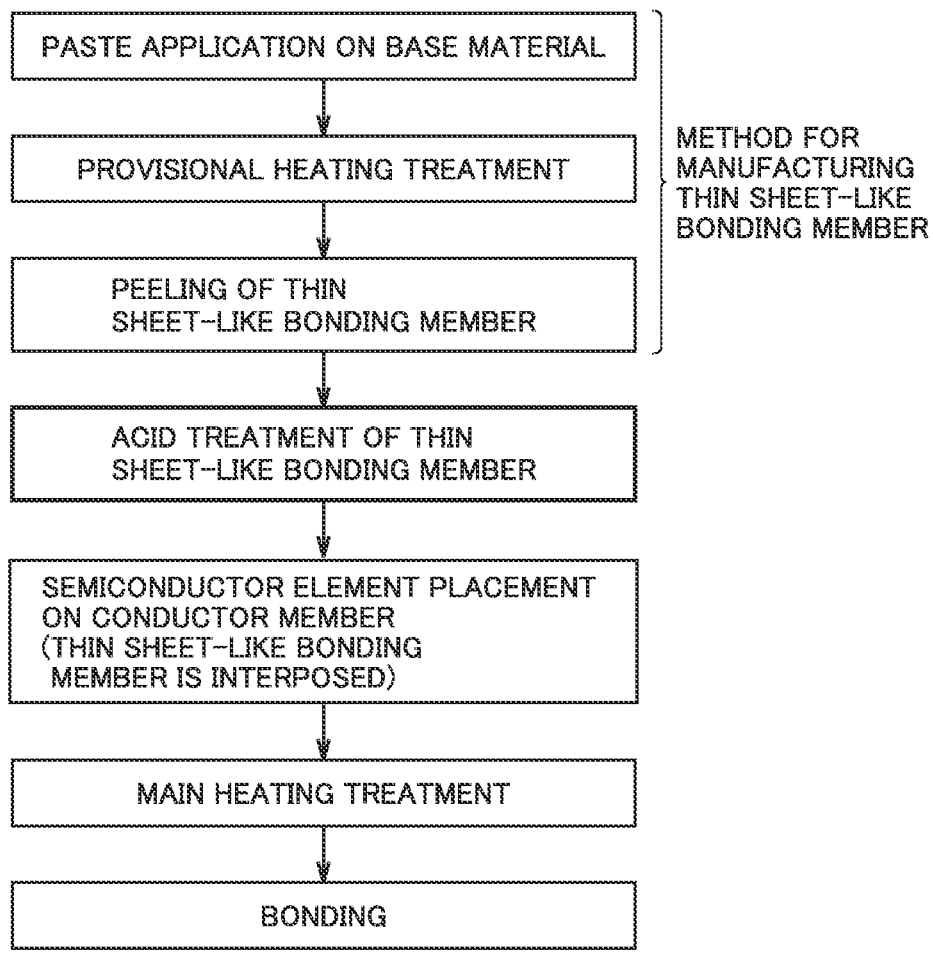
FIG. 12 is a flow chart showing the procedure of the manufacture of a semiconductor device in Embodiment 6.

In this embodiment, before semiconductor element 9 is placed on conductor member 7 (in a state in which thin sheet-like bonding member 8 is interposed), thin sheet-like bonding member 8 is subjected to acid treatment to remove the oxide film on the surface of thin sheet-like bonding member 8. In FIG. 12, the procedure of the manufacture of the semiconductor device in this embodiment is shown by a flow chart.

The chemical solution used for the acid treatment should be one that can remove the oxide film of the metals used for the thin sheet-like bonding member, and, for example, the flux shown in Embodiment 1 or an inorganic acid such as hydrochloric acid, sulfuric acid, or nitric acid can be used. When Sn is used for the low melting point metal, and Cu is used for the high melting point metal, the oxide film can be removed by immersion in a 10% by mass sulfuric acid aqueous solution for 1 to 3 min. When the immersion time is less than 1 min, there is a possibility that the oxide film cannot be completely removed. When the immersion time is more than 3 min, there is a risk that not only the oxide film but the metals themselves dissolve significantly.

After the acid treatment, thin sheet-like bonding member 8 is placed on conductor member 7. The subsequent steps are the same as Embodiment 5.

Higher bonding reliability between the conductor member and the semiconductor element can be realized by the manufacturing method of this embodiment.

Embodiment 7

Figure 13:
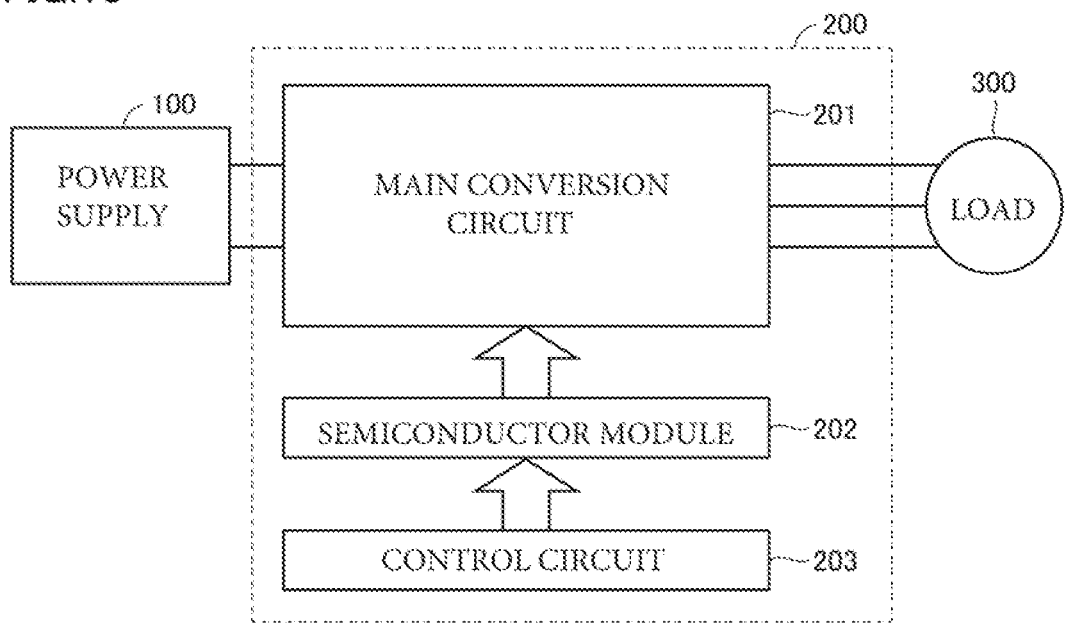
FIG. 13 is a block diagram showing the configuration of a power conversion system to which a power conversion device in Embodiment 7 is applied.

Embodiment 7 relates to a power conversion device to which the semiconductor device according to Embodiment 5 is applied. FIG. 13 is a block diagram showing the configuration of a power conversion system to which the power conversion device in Embodiment 7 is applied.

The power conversion system shown in FIG. 13 is composed of a power supply 100, a power conversion device 200, and a load 300. Power supply 100 is a direct current power supply and supplies direct current power to power conversion device 200. Power supply 100 can be composed of a variety of articles and, for example, may be a direct current utility, a solar battery, a storage battery, or the like or may be a rectifier circuit or an AC/DC converter connected to an alternating current utility, or the like. Power supply 100 may be a DC/DC converter that converts direct current power output from a direct current utility to direct current power or the like.

Power conversion device 200 is, for example, a three-phase inverter connected between power supply 100 and load 300 and converts direct current power supplied from power supply 100 to alternating current power and supplies the alternating current power to load 300. Power conversion device 200 includes a main conversion circuit 201 that converts direct current power to alternating current power and outputs the alternating current power, and a control circuit 203 that outputs a control signal that controls main conversion circuit 201 to main conversion circuit 201, as shown in FIG. 13.

Load 300 is a three-phase electric motor driven by alternating current power supplied from power conversion device 200. Load 300 is an electric motor that is not limited to a particular application and is mounted in various types of electrical apparatuses, and is used as an electric motor, for example, for a hybrid car, an electric car, a railroad vehicle, an elevator, or an air conditioning apparatus.

The details of power conversion device 200 will be described below. Main conversion circuit 201 includes switching elements and freewheeling diodes (not shown). By the switching of the switching elements, direct current power supplied from power supply 100 is converted to alternating current power, and the alternating current power is supplied to load 300.

Examples of specific circuit configurations of main conversion circuit 201 include a variety of circuit configurations, and main conversion circuit 201 according to this embodiment is, for example, a two-level three-phase full-bridge circuit and can be composed of six switching elements and six freewheeling diodes in antiparallel with the respective switching elements.

For example, the switching elements, freewheeling diodes, and the like of main conversion circuit 201 are formed by a semiconductor module 202 using the semiconductor device of Embodiment 5 described above. For example, for the six switching elements, every two switching elements are connected in series and constitute upper and lower arms. The upper and lower arms constitute the phases (U phase, V phase, and W phase) of the full-bridge circuit. The output terminals of the upper and lower arms, that is, the three output terminals of main conversion circuit 201, are connected to load 300.

Main conversion circuit 201 includes, for example, a drive circuit (not shown) that drives the switching elements, and the drive circuit may be built into semiconductor module 202 or provided separately from semiconductor module 202.

The drive circuit generates drive signals that drive the switching elements of main conversion circuit 201, and supplies the drive signals to the control electrodes of the switching elements of main conversion circuit 201.

Specifically, the drive circuit outputs drive signals that bring the switching elements into the ON state, and drive signals that bring the switching elements into the OFF state, to the control electrodes of the switching elements according to control signals from control circuit 203 described later. When the switching elements are maintained in the ON state, the drive signals are voltage signals no less than the threshold voltages of the switching elements (ON signals). When the switching elements are maintained in the OFF state, the drive signals are voltage signals no more than the threshold voltages of the switching elements (OFF signals).

Control circuit 203 controls the switching elements of main conversion circuit 201 so that necessary power is supplied to load 300. Specifically, the time during which the switching elements of main conversion circuit 201 are to be in the ON state (ON time) is calculated based on the power to be supplied to load 300. Main conversion circuit 201 can be controlled, for example, by PWM control in which the ON time of the switching elements is modulated according to the voltage to be output. Control circuit 203 outputs control commands (control signals) to the drive circuit that main conversion circuit 201 includes, so that at each point in time, ON signals are output to the switching elements to be in the ON state, and OFF signals are output to the switching elements to be in the OFF state. The drive circuit outputs ON signals or OFF signals as drive signals to the control electrodes of the switching elements according to these control signals.

In the power conversion device according to this embodiment, a semiconductor module using the semiconductor device according to Embodiment 5 is applied as the switching elements and freewheeling diodes of main conversion circuit 201, and therefore the reliability of the power conversion device can be improved.

In this embodiment, an example in which the power conversion device is applied to a two-level three-phase inverter has been described, but this embodiment is not limited to this, and this embodiment can be applied to a variety of power conversion devices, in this embodiment, a two-level power conversion device has been described, but this embodiment may be applied to power conversion devices such as three-level and multilevel power conversion devices, and may be applied to a single-phase inverter when power is supplied to a single-phase load. When power is supplied to a direct current load or the like, this embodiment may be applied to a DC/DC converter, an AC/DC converter, or the like.

This embodiment is not limited to the case where the load described above is an electric motor, and the load may be, for example, a power supply device for an electrical discharge machine, a laser processing machine, an induction heating cooker, a noncontact power feeding system, or the like, or a power conditioner for a solar power generation system or a power storage system.

The embodiments and the Examples disclosed this time should be considered as illustrative in all points and not restrictive. It is intended that the scope of the present disclosure is shown by the claims rather than the above-described description, and all changes within the meaning and scope equivalent to the claims are included.

Although various illustrative embodiments are described in this application, various features, aspects, and functions described in one or a plurality of embodiments are not limited to the application of a particular embodiment and can be applied to embodiments alone or in various combinations. Therefore, innumerable modifications not illustrated are assumed within the technical scope disclosed in the description of this application. The modifications include, for example, cases where at least one constituent is modified, added, or omitted, or cases where at least one constituent is extracted and combined with a constituent in another embodiment.

REFERENCE SIGNS LIST

1 first particles, 2 second particles, 21 unreacted second metal, 3 base material, 4 intermetallic compound, 5 resin particles, 6 cured resin, 61 thermosetting resin in liquid form, 7 conductor member (circuit board), 71 insulating layer, 72, 73 electrode, 8 thin sheet-like bonding member, 9 semiconductor element, 10 metallization layer, 100 power supply, 200 power conversion device, 201 main conversion circuit, 202 semiconductor module, 203 control circuit, 300 load.

The invention claimed is:

1. A method for manufacturing a thin sheet-like bonding member, comprising:
    applying a paste comprising first particles comprising a first metal, second particles comprising a second metal having a lower melting point than the first metal, and a solvent to a surface of a base material made of a substance that does not react with the second metal;
    heating the paste at a temperature lower than a melting point of the first metal and higher than the melting point of the second metal to form a thin sheet-like bonding member on the surface of the base material; and
    peeling the thin sheet-like bonding member from the base material to obtain the thin sheet-like bonding member.

2. The method for manufacturing a thin sheet-like bonding member according to claim 1, wherein the first metal comprises at least one metal selected from a group consisting of Cu, Ag, and Ni.

3. The method for manufacturing a thin sheet-like bonding member according to claim 1, wherein the second metal comprises at least one metal selected from a group consisting of Sn, Ag, Sb, Ni, P, Pt, Au, Bi, and In.

4. The method for manufacturing a thin sheet-like bonding member according to claim 1, wherein the first particles are plated with the second metal.

5. The manufacturing method according to claim 1, wherein the paste further comprises a flux.

6. The manufacturing method according to claim 1, wherein the paste further comprises resin particles.

7. The manufacturing method according to claim 6, wherein surfaces of the resin particles are plated with the second metal.

8. The manufacturing method according to claim 1, further comprising immersing the thin sheet-like bonding member peeled from the base material in a thermosetting resin in liquid form.

9. A thin sheet-like bonding member manufactured by the method according to claim 1.

10. The thin sheet-like bonding member according to claim 9, wherein an amount of the second metal that is unreacted is no less than 5% by mass and no more than 80% by mass based on a total amount of the thin sheet-like bonding member, and a melting point of an intermetallic compound comprising the first metal and the second metal as constituents is higher than the melting point of the second metal.

11. A method for manufacturing a semiconductor device, comprising:

placing a semiconductor element on a conductor member in a state in which the thin sheet-like bonding member according to claim 9 is interposed between the semiconductor element and the conductor member; and heating the thin sheet-like bonding member at a temperature lower than the melting point of the first metal and higher than the melting point of the second metal.

12. The manufacturing method according to claim 11, wherein before placing the semiconductor element on the conductor member, a liquid whose boiling point is lower than a melting point of the second metal is adhered to a surface of at least one of the semiconductor element, the thin sheet-like bonding member, and the conductor member.

13. The manufacturing method according to claim 12, wherein the liquid comprises a flux.

14. The manufacturing method according to claim 13, wherein the temperature in heating the thin sheet-like bonding member is higher than a boiling point of the flux.

15. The manufacturing method according to claim 11, wherein the semiconductor element plated with the second metal is used.

16. The manufacturing method according to claim 11, wherein the conductor member plated with the second metal is used.

17. The manufacturing method according to claim 11, comprising sandwiching a thin sheet of a metal comprising the second metal between the semiconductor element and the thin sheet-like bonding member or between thin sheet-like bonding member and the conductor member, before heating the thin sheet-like bonding member.

18. The method for manufacturing a semiconductor device according to claim 11, wherein the thin sheet-like bonding member is subjected to acid treatment before placing the semiconductor element on the conductor member in the state in which the thin sheet-like bonding member is interposed between the semiconductor element and the conductor member.

19. A semiconductor device manufactured by the method according to claim 11.

20. A power conversion device comprising the semiconductor device according to claim 19, a main conversion circuit that converts input power for output, and a control circuit that outputs a control signal that controls the main conversion circuit to the main conversion circuit.

* * * * *